United States Patent
Khater et al.

(10) Patent No.: US 12,119,854 B2
(45) Date of Patent: Oct. 15, 2024

(54) SYSTEMS AND METHODS FOR WIDEBAND RF INTERFERENCE DETECTION AND SUPPRESSION

(71) Applicant: Purdue Research Foundation, West Lafayette, IN (US)

(72) Inventors: Mohammad Abu Khater, West Lafayette, IN (US); Dimitrios Peroulis, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 42 days.

(21) Appl. No.: 18/112,604

(22) Filed: Feb. 22, 2023

(65) Prior Publication Data

US 2023/0268945 A1    Aug. 24, 2023

Related U.S. Application Data

(60) Provisional application No. 63/312,545, filed on Feb. 22, 2022.

(51) Int. Cl.
  *H04B 1/10*      (2006.01)
  *G01R 19/04*    (2006.01)

(52) U.S. Cl.
  CPC .......... *H04B 1/1027* (2013.01); *G01R 19/04* (2013.01)

(58) Field of Classification Search
  CPC ..... H04B 1/1027; H04B 1/1036; G01R 19/04
  See application file for complete search history.

(56) References Cited

U.S. PATENT DOCUMENTS

| 7,027,589 B2 * | 4/2006 | Shi | H04B 3/46 |
| | | | 379/345 |
| 7,495,450 B2 * | 2/2009 | Furse | H04W 24/00 |
| | | | 324/519 |
| 9,113,367 B2 * | 8/2015 | Gao | H04W 24/08 |

OTHER PUBLICATIONS

Yang, J. et al., "Instinctual interference-adaptive low-power receiver with combined feedforward and feedback control," MWCL, vol. 31, 2021.

Yagbasan, C. et al., "Robust X-band GaN LNA with integrated active limiter," in European Microwave Conference, 2018, pp. 1205-1208.

(Continued)

*Primary Examiner* — Dac V Ha
(74) *Attorney, Agent, or Firm* — Purdue Research Foundation

(57) ABSTRACT

Systems and methods for wideband RF interference detection and suppression include an open-circuit stub, a first voltage peak detector, a second voltage peak detector, an analog-to-digital converter (ADC), and a controller. The open-circuit stub is configured to receive an input signal. The first voltage peak detector is coupled at the open end of the open-circuit stub and configured to output a first voltage signal based on a portion of the input signal. The second voltage peak detector is coupled a distance away from the open end of the open-circuit stub and configured to output a second voltage signal based on the portion of the input signal. The controller is configured to generate an output control signal operable to adjust a signal filter based on the first digital voltage signal and the second digital voltage signal to suppress the portion of the input signal.

20 Claims, 8 Drawing Sheets

(56) References Cited

OTHER PUBLICATIONS

Semnani, A. et al., "A high-power widely tunable limiter utilizing an evanescent-mode cavity resonator loaded with a gas discharge tube," IEEE Trans. on Plasma Science, 2016.

Shojaei-Asanjan, D. et al., "Tunable rf mems-based frequency-dependent power limiter," IEEE Transactions on Microwave Theory and Techniques, vol. 64, No. 12, pp. 4473-4481, 2016.

Yang, W. et al., "Frequency-selective limiters using triple-mode filters," IEEE Access, vol. 8, p. 114 854-114 863, 2020.

\* cited by examiner

TABLE 1
COMPARISON WITH STATE-OF-THE-ART.

| Ref. | Bandwidth (GHz) | Interference known? | Response time | Tech. |
|---|---|---|---|---|
| [4] | 2.3–2.8# | Y | NA (100's $\mu s$#) | MEMS |
| [5] | 1.5–2 | Y | NA (100's ms#) | PCB COTS |
| This work | 2–8 | N | 1.1 $\mu s$ | PCB COTS |

: Estimated from technology. COTS: Commercial off-the-shelve

FIG. 6

SYSTEMS AND METHODS FOR WIDEBAND RF INTERFERENCE DETECTION AND SUPPRESSION

CROSS-REFERENCE TO RELATED APPLICATIONS

This application is related to and claims the priority benefit of U.S. Provisional Patent Application No. 63/312,545, entitled "Systems and Methods for Wideband RF Interference Detection and Suppression," filed Feb. 22, 2022, the contents of which are hereby incorporated by reference in their entirety into the present disclosure.

GOVERNMENT SUPPORT CLAUSE

This invention was made with government support under Grant No. 2030257 awarded by the National Science Foundation. The government has certain rights in the invention.

TECHNICAL FIELD

The present application relates to wireless communication systems and methods, and specifically to wideband radio frequency systems that are operable to detect and suppress arbitrary interference signals.

BACKGROUND

Strong interferers are one of the major hurdles in wideband communications.

High-power blockers can saturate receivers and possibly damage front-end devices. This is frequently addressed by employing broadband high-power active limiters (e.g., GaN limiters). This often leads to additional power consumption. Moreover, while this approach reduces the potential of electrical or thermal breakdowns, it cannot recover an interferer-blocked communication channel. This limitation also applies to receivers protected by passive broadband limiters. Alternatively, frequency-selective limiters can discerningly suppress incoming high-power interferers, while maintaining the fidelity of the desirable communication channels. Such approaches, however, often exhibit the drawback of requiring prior knowledge of the blocker's frequency. In addition, the inherently limited bandwidth of frequency-selective limiters, along with slow-response times, further limit their application space. Thus, improved wideband RF interference detection and suppression systems are needed.

SUMMARY

Described herein are systems and methods related to detecting and suppressing interference signals during wideband communications. To that end, systems can include an open-circuit stub configured to receive an input signal, a first voltage peak detector coupled at the open end of the open-circuit stub, a second voltage peak detector coupled a distance away from the open end of the open-circuit stub, an analog-to-digital converter (ADC) communicatively coupled with the first voltage peak detector and second voltage peak detector, and a controller communicatively coupled with the ADC. The open-circuit stub can define an open end. The first voltage peak detector can be configured to output a first voltage signal based on a portion of the input signal, and the second voltage peak detector can be configured to output a second voltage signal based on the portion of the input signal. The first voltage signal and the second voltage signal can collectively quantify a standing wave pattern representative of the portion of the input signal. The ADC can be configured to convert the first voltage signal to a first digital voltage signal and the second voltage signal to a second digital voltage signal. Additionally, the controller can be configured to receive the first digital voltage signal and the second digital voltage signal from the ADC. Thereafter, the controller can be configured to generate an output control signal operable to adjust a signal filter based on the first digital voltage signal and the second digital voltage signal to suppress the portion of the input signal.

In some embodiments of the system, the controller can be configured to normalize the second digital voltage signal relative to the first digital voltage signal and to reference a lookup table to formulate the output control signal based upon the normalization. The controller can also be configured to determine both a power value and a frequency value of the portion of the input signal.

In some embodiments, the second voltage peak detector can be coupled $\lambda/4$ from the open end of the open-circuit stub, where $\lambda$ represents a guided wavelength of a maximum detectable frequency.

Various methods can also be used to detect and suppress interference signals during wideband communications. One embodiment of a method can include receiving an input signal for passing through a band-stop filter, transferring the input signal to an open-circuit stub, quantifying a standing wave pattern representative of the signal interference portion of the input signal, and generating a filter control signal based on the standing wave pattern. The filter control signal can be operable to adjust a tunable band-stop filter to at least partially suppress the signal interference portion.

Some embodiments of the method can further include transferring the filter control signal to the band stop filter such that the filter control signal is operable to adjust the tunable band-stop filter based on the control signal. Still further, some method embodiments can include amplifying the input signal prior to transferring the input signal to the open-circuit stub.

In other embodiments of the method, prior to quantifying a standing wave pattern representative of the signal interference portion, the method can include identifying a power component and a frequency component of the signal interference portion. Identifying a power component and a frequency component of the signal interference portion can include one or more of detecting a first voltage signal at an open-circuit position of the open-circuit stub, detecting a second voltage signal a distance away from the open-circuit position of the open-circuit stub, normalizing the second voltage signal to the first voltage signal.

This summary is provided to introduce a selection of the concepts that are described in further detail in the detailed description and drawings contained herein. This summary is not intended to identify any primary or essential features of the claimed subject matter. Some or all of the described features may be present in the corresponding independent or dependent claims, but should not be construed to be a limitation unless expressly recited in a particular claim. Each embodiment described herein does not necessarily address every object described herein, and each embodiment does not necessarily include each feature described. Other forms, embodiments, objects, advantages, benefits, features, and aspects of the present disclosure will become apparent to one of skill in the art from the detailed description and drawings contained herein. Moreover, the various apparatuses and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is unnecessary.

BRIEF DESCRIPTION OF THE DRAWINGS

While the specification concludes with claims which particularly point out and distinctly claim this technology, it is believed this technology will be better understood from the following description of certain examples taken in conjunction with the accompanying drawings, in which like reference numerals identify the same elements and in which:

FIG. 6 depicts a table illustrating a comparison of experimental results between the systems and methods described and systems of the prior art.

Figure 1:
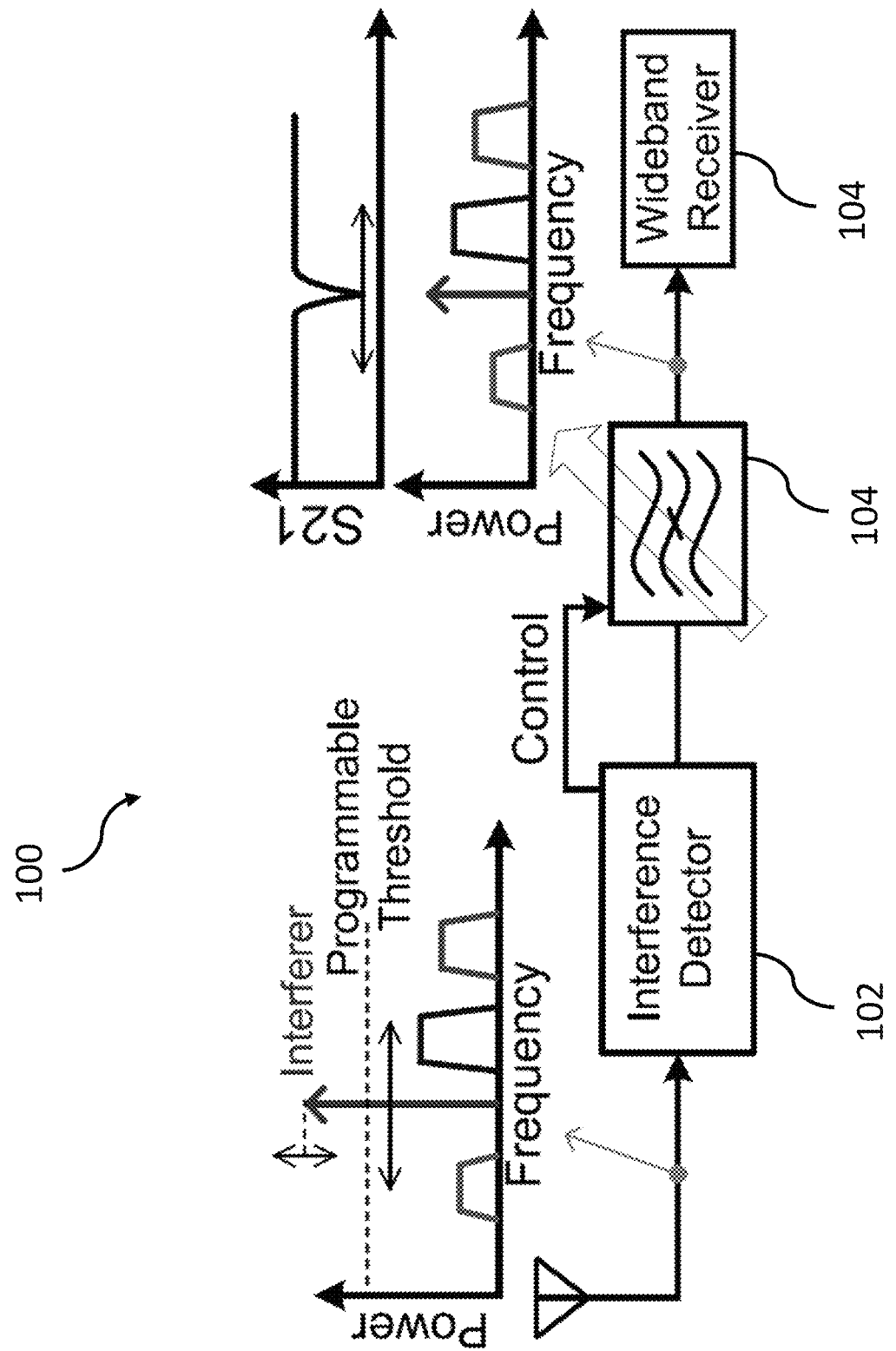
FIG. 1 depicts a diagram of one example system operable to rapidly detect and deactivate an interferer of unknown frequency and power, where the detection data may be used to tune a band-stop filter to suppress this interferer if its power exceeds an adjustable threshold level.

The drawings are not intended to be limiting in any way, and it is contemplated that various embodiments of the technology may be carried out in a variety of other ways, including those not necessarily depicted in the drawings. The accompanying drawings incorporated in and forming a part of the specification illustrate several aspects of the present technology, and together with the description serve to explain the principles of the technology; it being understood, however, that this technology is not limited to the precise arrangements shown, or the precise experimental arrangements used to arrive at the various graphical results shown in the drawings.

DETAILED DESCRIPTION OF THE ILLUSTRATED EMBODIMENTS

The following description of certain examples of the technology should not be used to limit its scope. Other examples, features, aspects, embodiments, and advantages of the technology will become apparent to those skilled in the art from the following description, which is by way of illustration, one of the best modes contemplated for carrying out the technology. As will be realized, the technology described herein is capable of other different and obvious aspects, all without departing from the technology. Accordingly, the drawings and descriptions should be regarded as illustrative in nature and not restrictive.

It is further understood that any one or more of the teachings, expressions, embodiments, examples, etc. described herein may be combined with any one or more of the other teachings, expressions, embodiments, examples, etc. that are described herein. The following-described teachings, expressions, embodiments, examples, etc. should therefore not be viewed in isolation relative to each other. Various suitable ways in which the teachings herein may be combined will be readily apparent to those of ordinary skill in the art in view of the teachings herein. Such modifications and variations are intended to be included within the scope of the claims.

Described herein is a wideband radio frequency system and method which can be configured to detect both the power and frequency of an arbitrary interferer within a two-octave bandwidth and subsequently deactivate or suppress the interferer through a frequency-tunable narrowband band stop filter. Embodiments of the systems and methods can be completed within approximately one microsecond. The systems described autonomously generate and quantify frequency and power dependent standing wave patterns of the incoming signal based upon the detection of the power and frequency of the incoming signal. All frequencies and power levels of the incoming signals are simultaneously mapped to the system's detection scheme without requiring time-consuming spectrum or power-searching steps or equipment. In some embodiments, the system is operable to detect interfering signals with unknown and arbitrary frequencies in at least the 2-8 GHz frequency band and powers in at least the −5 dBm to +15 dBm range. Further, the proposed system may be implemented with low-cost, off-the-shelf components. The detectors and filters described are capable of and configured to suppress an interferer and they can include a programmable power threshold.

The wideband detection systems and methods presented herein are configured to determine both the incoming power and frequency of an arbitrary interferer within a microsecond. This information can be used to tune a filter, such as a band-stop filter (BSF), to output a signal which suppresses the interference portion of the signal. A first embodiment of a detection and suppression system (100) is shown in FIG. 1. As will be described in greater detail below, the detection portion (102) of the system is configured to create an input-spectrum-generated standing wave pattern from an open-circuit stub. This standing wave pattern can be generated by weakly coupling the input signal(s) to the open-circuit stub. Voltage peak detectors can be used to sense the standing wave pattern. In some experiments, this detection system (102) can detect interferers in the 2-8 GHz band, with a power level of −5 to +15 dBm. Advantageously, this detection system (102) can be assembled with low-cost, off-the-shelf components. In addition, a tunable BSF (104) can be controlled to demonstrate interference suppression prior to passing the signals to the wideband receiver (106). The system (100), including the detecting portion (102), control operations, and the filter (104), is therefore operable to suppress an interferer (i.e., an arbitrary interference signal) within 1.1 μs of receiving the interference signal, and can do so while utilizing a programmable power threshold.

Figure 2A:
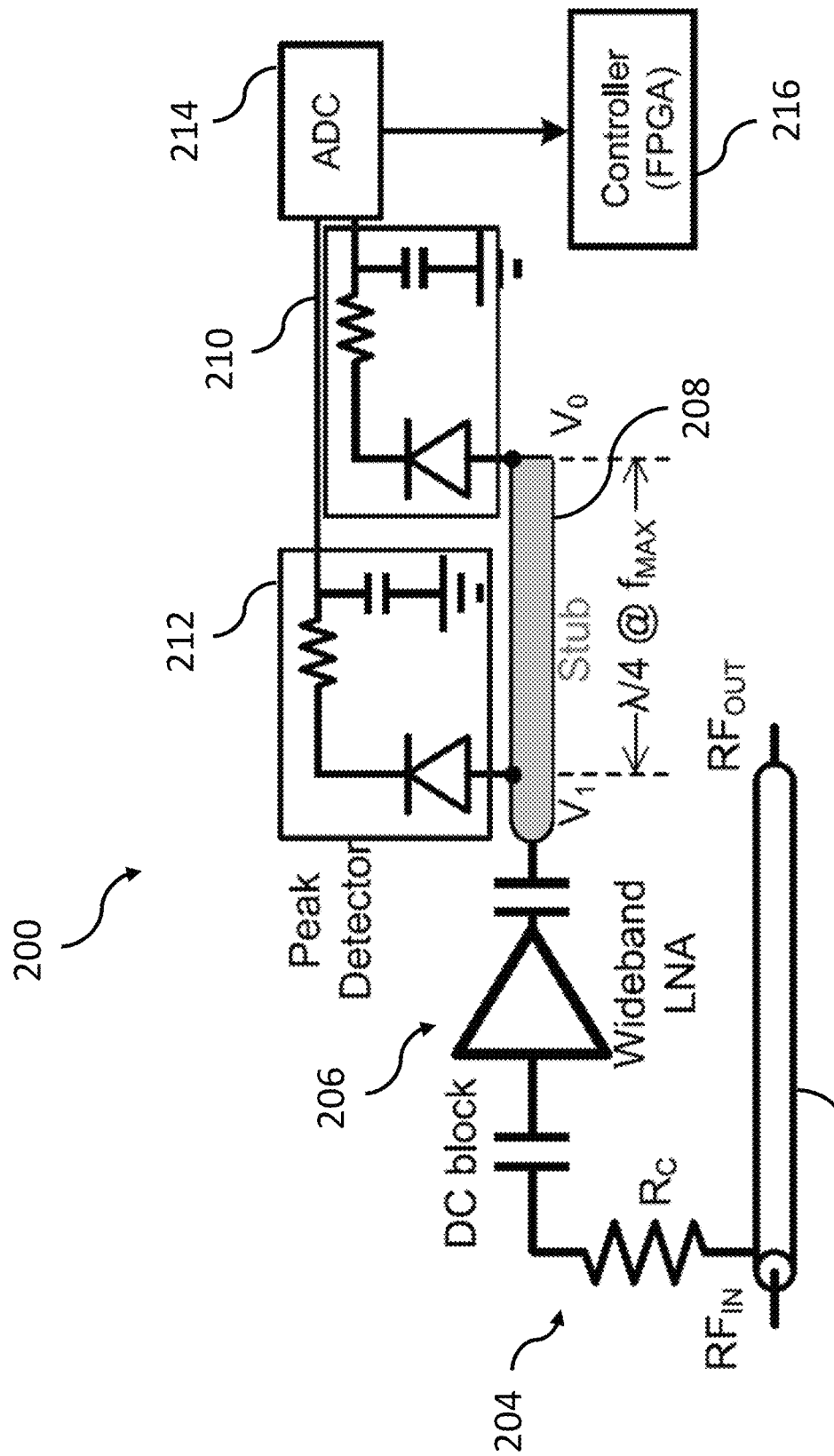
FIG. 2A depicts a diagram of one exemplary interferer detection system, where peak detectors sense the standing wave voltages on an open-circuit stub, which reveal the power and the frequency of the interferer.

FIG. 2A shows one detection system (200) configurable to detect the presence of an interferer in the band of interest and pass determined interference signals to a controller of the filter. A weak coupling (204), such a coupling implemented using a resistor or a directional coupler, of the input signal may be used. While reactive coupling may be preferred in many instances due to its low loss, resistor (204) can also be used. Resistor (204) can provide a better frequency-independent response relative to reactive coupling, which can further be advantageous for multi-octave bandwidths in certain applications. The value of the resistor can be chosen such that it is practically innocuous to the insertion loss or the reflection level. The coupled signal is then amplified via an amplifier (206) to ensure it is at a detectable level. The gain of the amplifier (206) can be controlled to target a range of detectable power. For example, a predetermined range from −5 dBm to +15 dBm can be targeted. The output of the amplifier (206) can drive an open-circuit stub (208), which is configured to create a standing wave pattern that reveals the power and the frequency of the highest power signal (that is, assuming other signals have much lower power).

Figures 2B, 2C:
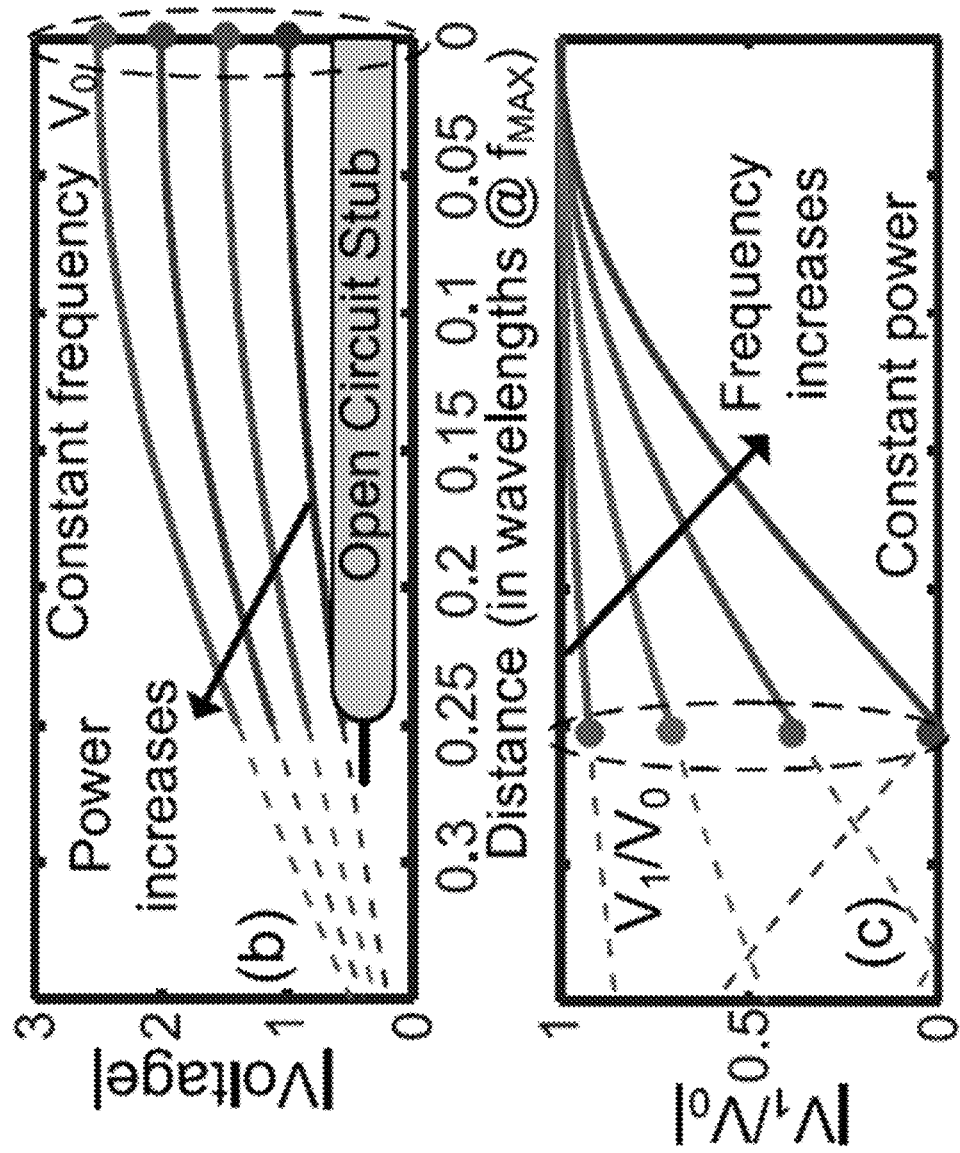
FIG. 2B depicts the voltage at the open end of the open-circuit stub being power-dependent.
FIG. 2C depicts the normalized voltage $\lambda/4$ away from the open end being a bijective function of the interferer frequency.

Two voltage peak detectors (210, 212) may be coupled with the open-circuit stub to quantify the standing wave pattern. The first peak detector (210) may be coupled at the open end of the open-circuit stub (V0). Since V0 is directly proportional to the interferer power (regardless of the frequency), a look-up-table may be referenced such that the reading of V0 can be translated to power. FIG. 2B shows how the voltage across the open-circuit stub is a function of the power of the interferer. The second peak detector (212) may be coupled at λ/4 from the open end, where λ is the guided wavelength of the maximum detectable frequency $f_{MAX}$. Since the voltage there, V1, is also power dependent, V1 may be normalized to V0. This normalization results in a bijective relationship to frequency. From transmission line theory, it can be shown that this relationship is:

$$\left|\frac{V_1}{V_0}\right| = \left|\cos\left(\frac{\pi}{2}\frac{f}{f_{MAX}}\right)\right|,$$

where f is the interferer frequency. This relationship is plotted in FIG. 2C for various interferer frequencies. From the formula above, it can be seen that frequencies above $f_{MAX}$ result in a non-bijective relationship between the normalized V1 and the frequency.

The voltages from the peak detectors may then be converted to digital signals for analysis using one or more Analog to Digital Converters (ADCs) (214). A controller (216), for example a field programmable gate array (FPGA) or other similar controller, can be utilized to receive and analyze the voltages from the ADCs, normalize V1, and take the necessary control decision to tune the BSF based on the available look-up-table.

Figure 3A:
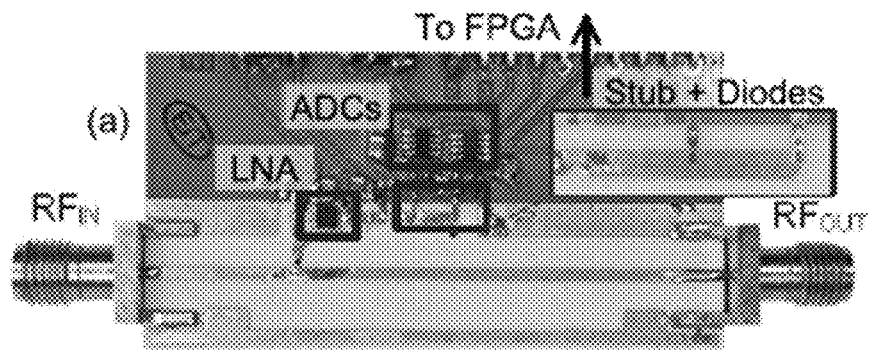
FIG. 3A depicts an implemented PCB of the interference detector along with its associated components.

The interference detection can be designed on, for example, a 20-mil thick RO-4003 substrate. The following components can be used, although it should be understood that this merely represents one example system which performs the functions described herein, and therefore is not intended to be limiting: Wideband LNA: HMC8410; peak detector Schottky diodes: MADS-002502-1246HP; ADCs: LTC2315CTS8. The assembled PCB is shown in FIG. 3A. The coupling resistor $R_C$ is 150, followed by a 0.5 pF capacitor. The BSF used in this work is a substrate-integrated structure with PIN diode tuning ability.

Figure 3B:
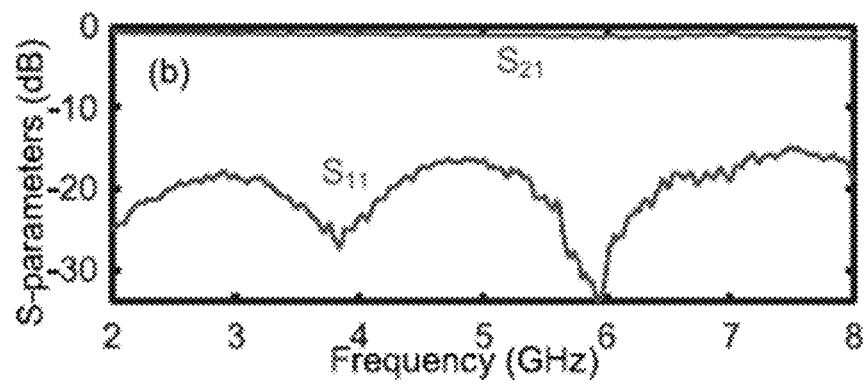
FIG. 3B depicts measurement of the RF line showing minimal effect of the detection method on the frequency response.

First, the response of the through transmission line ($RF_{IN}$ to $RF_{OUT}$) is measured to demonstrate the effect of the coupling. This measurement is shown in FIG. 3B. It can be seen that the coupling exhibits no adverse impact on the transmission line performance.

Figure 3C:
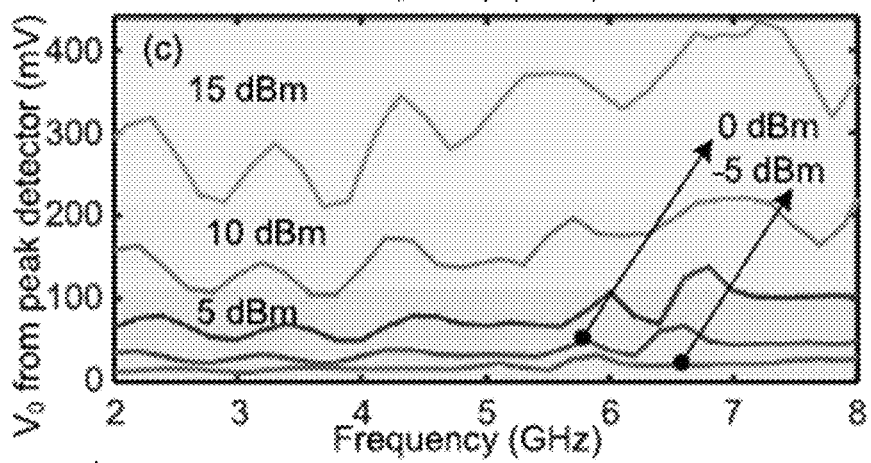
FIG. 3C depicts the measured voltage at the open end of the open-circuit stub (V0 in FIG. 2), this voltage of which reveals the input power.

Since V0 is directly proportional to the input power, FIG. 3C shows this relationship versus frequency. These data are used to determine whether the input power is above a given threshold. While ideally V0 should not vary versus frequency, the amplifier gain response, in addition to non-linear effects from the diodes, cause those frequency-dependent variations. Nevertheless, these variations have no major effect on the performance of the system.

Figure 3D:
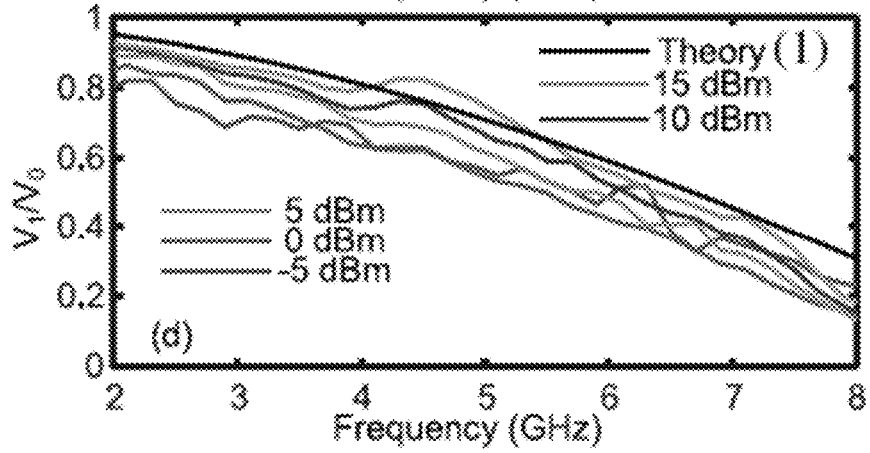
FIG. 3D depicts the ratio V1/V2 revealing the frequency of the interferer.

FIG. 3D shows the measured normalizing ratio from the above formula. This relationship is used to determine the frequency of the interferer. The measurements generally align with the theoretical analysis. The deviations are primarily due to the above-mentioned non-ideal effects, in addition to the power-dependent response of the active components. This, however, does not impair the operation of the detection because the power is already known (from measuring V0). As a result, the proper curve is selected during operation. In addition, the ripple in FIG. 3D is within the bandwidth of the BSF, which implies that the detector can still suppress the interferer.

Figure 4A:
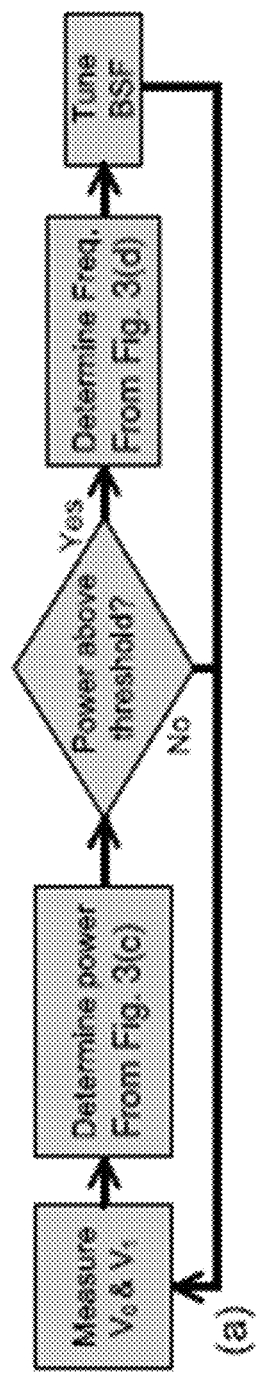
FIG. 4A depicts a flowchart illustrating the operation of the FPGA controller of the interference detector.
Figure 4B:
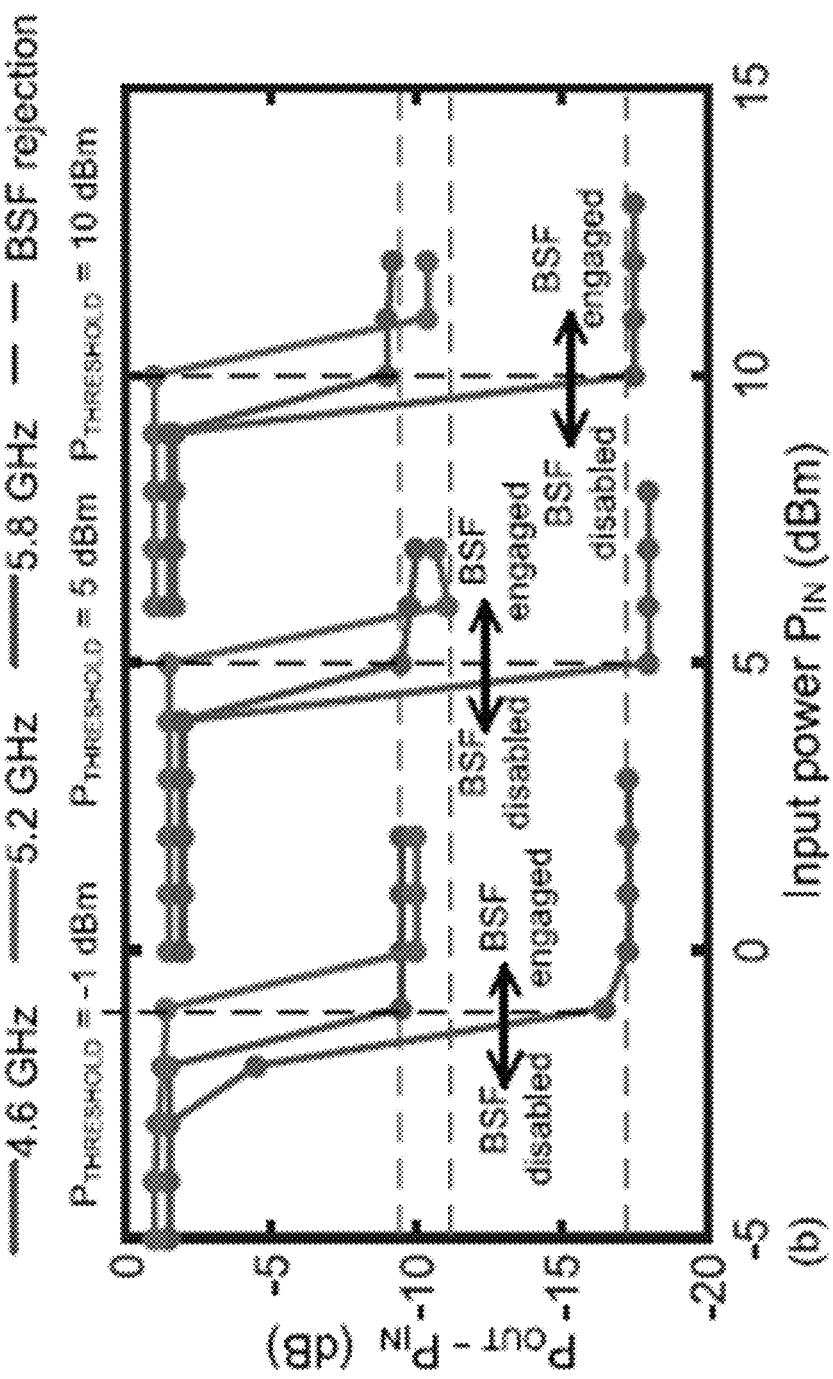
FIG. 4B depicts the detector, along with a BSF, being used as a programmable frequency-selective power limiter, where the measurements shown are at various frequencies and different power thresholds with no user intervention, and the suppression is only limited by the performance of the BSF.

The FPGA controller is constantly reading the voltages V0 and V1 to make decisions based on the interferer frequency and power. The flowchart in FIG. 4A summarizes its operation. The measurements in FIG. 4B show how the detector is used in a frequency-selective power limiter. The threshold power level (PTHRESHOLD) is user-programmable (no hardware redesign is required). The demonstrated power levels are −1, +5, and +10 dBm. The demonstrated frequencies are only limited by the available bandwidth of the employed BSF. The same applies to the suppression level of the interferer. Hence the interferer suppression is only limited by the quality of the employed BSF and not the detection scheme. It is worth noting here that this curve works in both directions of input power: low-to-high and high-to-low.

Figure 5A:
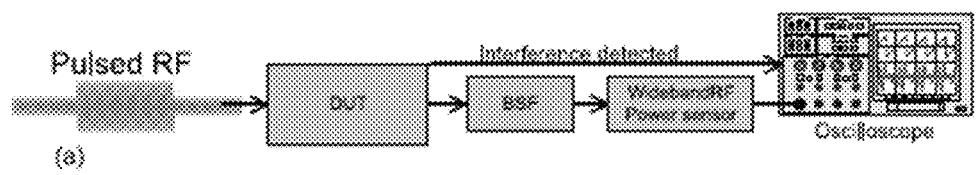
FIG. 5A depicts one exemplary response time measurement configuration.

The response time of the detector is a critical protection metric. To measure the response time, the setup in FIG. 5A is used. Two signals are monitored with the oscilloscope. The first is the sensed output RF power from the detector and the BSF, and the second is an "interference detected" logic signal from the FPGA. In this measurement, the input power is pulsed between −5 dBm and +12 dBm with a 5 μs width.

Figure 5B:
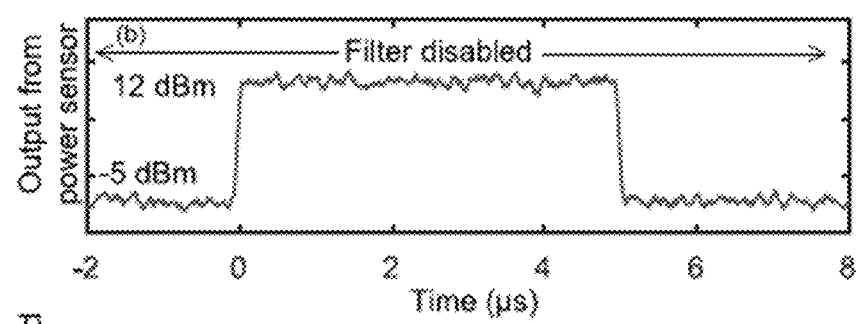
FIG. 5B depicts the output of the power sensor when excited with an RF pulse (5.5 GHz), with the BSF disabled.
Figure 5C:
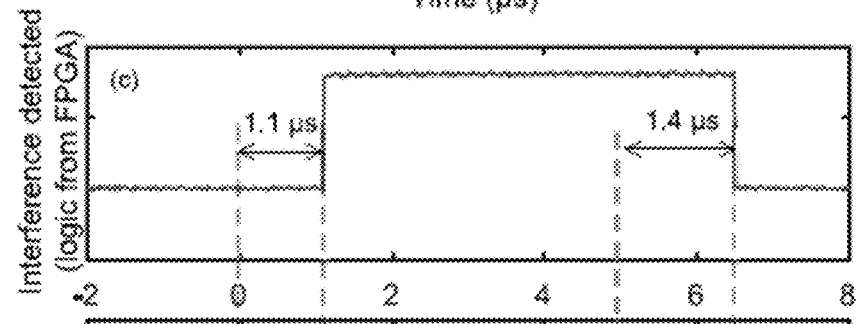
FIG. 5C depicts the logic output of the FPGA showing an interference detection when the RF pulse is at the high power.
Figure 5D:
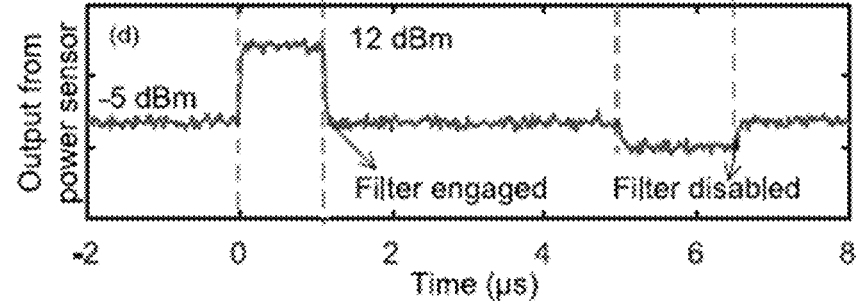
FIG. 5D depicts the output of the power sensor when the BSF is enabled, showing the system is able to suppress the interferer within 1.1 µs.

First, the setup is measured with the BSF disabled. This way, the output of the power sensor can be measured for comparison purposes. The result in FIG. 5B shows the expected output from the power sensor. Next, the BSF is enabled. It can be seen from FIG. 5C that the interference is detected after 1.1 μs. This time is approximately equally divided between the peak detectors and the ADCs. Once the FPGA detects the interferer, it tunes the BSF to the detected frequency (by switching the proper PIN diodes). This causes the output power to drop. This is shown in FIG. 5D. Conversely, when the RF high-power pulse ends, the filter is no longer necessary, and it is removed from the signal path. This recovery response time is 1.4 µs.

Table I of FIG. 6 compares the achieved performance to published state-of-the-art. The presented detector is significantly wider in bandwidth, has a much faster response time, and is more adaptive by requiring no prior knowledge of the interferer. As shown in Table I, prior art reference [4] denotes the systems described in D. Shojaei-Asanjan and R. R. Mansour, "Tunable rf mems-based frequency-dependent power limiter," IEEE Transactions on Microwave Theory and Techniques, vol. 64, no. 12, pp. 4473-4481, 2016. Further, as shown in Table I, prior art reference [5] denotes the systems described in W. Yang, M. Abu Khater, E. J. Naglich, D. Psychogiou, and D. Peroulis, "Frequency-selective limiters using triple-mode filters," IEEE Access, vol. 8, pp. 114 854-114 863, 2020.

Accordingly, the first wideband interference detection and suppression method with approximately 1 µs response time for an interferer with unknown frequency and power has been presented. In addition to the concept and design method, a system is demonstrated with two octaves bandwidth (2-8 GHz) capable of sensing the power and frequency of unknown interferers. This advantageous performance is critical for protecting sensitive receivers from harmful RF pulses.

Figure 7:
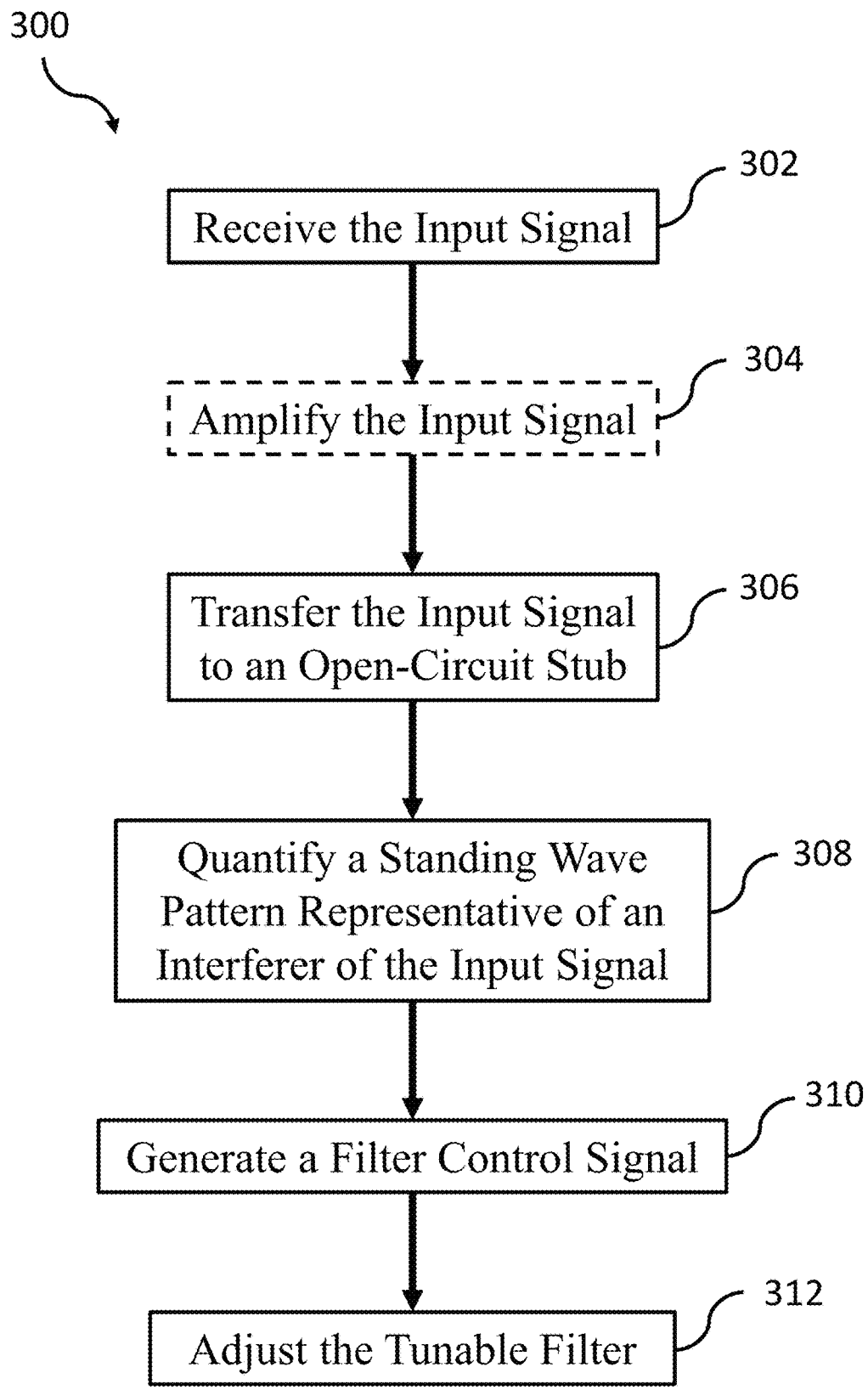
FIG. 7 depicts one exemplary method of detecting an input signal and selectively suppressing a portion of the input signal.

FIG. 7 shows one method (300) of detecting an input signal and selectively suppressing an interference portion of the input signal. At step (302), an input signal is received for passing through a band-stop filter. As described herein, the input signal may be a wideband signal which can sometimes include one or more signal interferers contained therein. If needed, at step (304), the input signal may be amplified prior to transferring the input signal to the open-circuit stub, at step (306). Next, at step (308), a standing wave pattern in quantified that is representative of the signal interference portion of the input signal. Quantifying the standing wave pattern may include identifying one or both of a power component and a frequency component of the signal interference portion. In some embodiments, the highest power signal may be quantified. In still some embodiments, identifying a power component and a frequency component of the signal interference portion includes detecting a first voltage signal at an open-circuit position of the open-circuit stub, detecting a second voltage signal a distance away from the open-circuit position of the open-circuit stub, and normalizing the second voltage signal to the first voltage signal. The distance away from the open-circuit position of the open-circuit stub can be defined as $\lambda/4$ from the open end, where $\lambda$ represents a guided wavelength of a maximum detectable frequency. Next, at step (310), a filter control signal may be generated based on the standing wave pattern, the filter control signal being operable to adjust a tunable band-stop filter to at least partially suppress the signal interference portion. In some embodiments, generating a filter control signal based on the standing wave pattern can include referencing a lookup table to determine the filter control signal. Finally, at step (312), the filter control signal can be transferred to the band stop filter to adjust the tunable band-stop filter. As such, the input signal may be selectively suppressed in near real-time.

Reference systems that may be used herein can refer generally to various directions (for example, upper, lower, forward and rearward), which are merely offered to assist the reader in understanding the various embodiments of the disclosure and are not to be interpreted as limiting. Other reference systems may be used to describe various embodiments, such as those where directions are referenced to the portions of the device, for example, toward or away from a particular element, or in relations to the structure generally (for example, inwardly or outwardly).

While examples, one or more representative embodiments and specific forms of the disclosure have been illustrated and described in detail in the drawings and foregoing description, the same is to be considered as illustrative and not restrictive or limiting. The description of particular features in one embodiment does not imply that those particular features are necessarily limited to that one embodiment. Some or all of the features of one embodiment can be used in combination with some or all of the features of other embodiments as would be understood by one of ordinary skill in the art, whether or not explicitly described as such. One or more exemplary embodiments have been shown and described, and all changes and modifications that come within the spirit of the disclosure are desired to be protected.

We claim:

1. A system, comprising:
   (a) an open-circuit stub configured to receive an input signal, wherein the open-circuit stub defines an open end;
   (b) a first voltage peak detector coupled at the open end of the open-circuit stub, wherein the first voltage peak detector is configured to output a first voltage signal based on a portion of the input signal;
   (c) a second voltage peak detector coupled a distance away from the open end of the open-circuit stub, wherein the second voltage peak detector is configured to output a second voltage signal based on the portion of the input signal, wherein the first voltage signal and the second voltage signal collectively quantify a standing wave pattern representative of the portion of the input signal;
   (d) an analog-to-digital converter (ADC) communicatively coupled with the first voltage peak detector and second voltage peak detector, wherein the ADC is configured to convert the first voltage signal to a first digital voltage signal and the second voltage signal to a second digital voltage signal; and
   (e) a controller communicatively coupled with the ADC and configured to receive the first digital voltage signal and the second digital voltage signal from the ADC, wherein the controller is configured generate an output control signal operable to adjust a signal filter based on the first digital voltage signal and the second digital voltage signal to suppress the portion of the input signal.

2. The system of claim 1, wherein the controller is configured to normalize the second digital voltage signal relative to the first digital voltage signal and to reference a lookup table to formulate the output control signal based upon the normalization.

3. The system of claim 1, wherein the controller is configured to determine both a power value and a frequency value of the portion of the input signal.

4. The system of claim 1, wherein the portion of the input signal includes an interference signal.

5. The system of claim 1, wherein the distance is $\lambda/4$ from the open end, where $\lambda$ represents a guided wavelength of a maximum detectable frequency.

6. The system of claim 1, wherein the open-circuit stub is configured to receive the input signal via a weak coupling.

7. The system of claim 6, wherein the weak coupling is a reactive coupling.

8. The system of claim 6, wherein the weak coupling includes a coupling resistor.

9. The system of claim 1, further comprising an amplifier configured to amplify the input signal and transfer the input signal to the open-circuit stub, wherein a gain of the amplifier is controllable to a predetermined target range of detectable power.

10. The system of claim 9, wherein the predetermined target range includes power ranging from −5 dBm to +15 dBm.

11. The system of claim 1, wherein detect interfering signals with unknown and arbitrary frequencies in at least a two gigahertz to eight gigahertz frequency band.

12. A method, comprising:
(a) receiving an input signal for passing through a band-stop filter, wherein the input signal includes a signal interference portion;
(b) transferring the input signal to an open-circuit stub;
(c) quantifying a standing wave pattern representative of the signal interference portion of the input signal; and
(d) generating a filter control signal based on the standing wave pattern, wherein the filter control signal is operable to adjust a tunable band-stop filter to at least partially suppress the signal interference portion.

13. The method of claim 12, further comprising transferring the filter control signal to the band stop filter, whereby the filter control signal is operable to adjust the tunable band-stop filter based on the control signal.

14. The method of claim 12, wherein the input signal includes a wideband radio frequency (RF) signal.

15. The method of claim 12, further comprising amplifying the input signal prior to transferring the input signal to the open-circuit stub.

16. The method of claim 12, wherein prior to quantifying a standing wave pattern representative of the signal interference portion, identifying a power component and a frequency component of the signal interference portion.

17. The method of claim 16, wherein identifying a power component and a frequency component of the signal interference portion includes:
(i) detecting a first voltage signal at an open-circuit position of the open-circuit stub,
(ii) detecting a second voltage signal a distance away from the open-circuit position of the open-circuit stub, and
(iii) normalizing the second voltage signal to the first voltage signal.

18. The method of claim 17, wherein the distance away from the open-circuit position of the open-circuit stub is $\lambda/4$ from the open end, where $\lambda$ represents a guided wavelength of a maximum detectable frequency.

19. The method of claim 12, wherein generating a filter control signal based on the standing wave pattern includes referencing a lookup table to determine the filter control signal.

20. A system, comprising:
(a) a band-stop signal filter configured to receive an input signal and selectively suppress an interference portion of the input signal;
(b) an open-circuit stub configured to receive the input signal, wherein the open-circuit stub defines an open end;
(c) voltage peak detection system configured to detect a plurality of voltage characteristics of the input signal, wherein the plurality of voltage characteristics quantify a power component and a frequency component of the interference portion of the input signal; and
(d) a controller communicatively coupled with the voltage peak detection system and configured to receive the plurality of voltage characteristics, wherein the controller is configured generate an output control signal operable to adjust the band-stop signal filter, based on the plurality of voltage characteristics, to selectively suppress the interference portion of the input signal.

* * * * *